United States Patent [19]

Desmarais

[11] Patent Number: 4,772,812
[45] Date of Patent: Sep. 20, 1988

[54] TRI-STATE OUTPUT BUFFER CIRCUIT INCLUDING A CAPACITOR AND DYNAMIC DEPLETION MODE SWITCHING DEVICE

[75] Inventor: Richard Z. Desmarais, Cupertino, Calif.

[73] Assignee: Data General Corporation, Westboro, Mass.

[21] Appl. No.: 286,822

[22] Filed: Jul. 27, 1981

[51] Int. Cl.$^4$ ............... H03K 19/017; H03K 19/094; H03K 4/58; H03K 17/10
[52] U.S. Cl. .................................... 307/473; 307/482; 307/578; 307/270
[58] Field of Search ............... 307/270, 473, 475, 482, 307/578

[56] References Cited

U.S. PATENT DOCUMENTS

| | | | |
|---|---|---|---|
| 4,217,502 | 8/1980 | Suzuki et al. | 307/473 |
| 4,280,065 | 7/1981 | Minato et al. | 307/270 X |
| 4,291,242 | 9/1981 | Schriber | 307/578 X |
| 4,329,600 | 5/1982 | Stewart | 307/473 X |

OTHER PUBLICATIONS

Knepper, "Dynamic Depletion Mode: An E/D MOSFET Circuit Method for Improved Performance", IEEE Journal of Solid State Circuits, vol. SC-13, No. 5, Oct. 1978, pp. 542-548.

Primary Examiner—Stanley D. Miller
Assistant Examiner—David R. Bertelson
Attorney, Agent, or Firm—Limbach, Limbach & Sutton

[57] ABSTRACT

A tri-state output buffer is provided which incorporates a dynamic depletion mode circuit. The tri-state buffer has an output driver circuit which includes a pull-up and a pull-down transistor device. Rapid switching of the pull-up transistor from a nonconducting state to a conducting state is accomplished with a bootstrap circuit. The bootstrap circuit includes a capacitor and a dynamic depletion mode switching device. The dynamic depletion mode device acts to rapidly transfer the charge from the capacitor to the gate of the pull-up transistor. Additionally an invertor or voltage driver, connected between the bootstrap circuit dynamic depletion mode switching device and the capacitor provides a voltage jump across said capacitor to further increase the switching speed of the pull-up transistor.

3 Claims, 1 Drawing Sheet

TRI-STATE OUTPUT BUFFER CIRCUIT INCLUDING A CAPACITOR AND DYNAMIC DEPLETION MODE SWITCHING DEVICE

BACKGROUND OF THE INVENTION

This invention relates to tri-state output buffer circuits, and in particular, to a tri-state output buffer circuit utilizing dynamic depletion mode MOS devices.

Current, tri-state output buffers typically use either enhancement mode MOS devices or a combination of enhancement and depletion mode devices. These configurations are deficient in that they have output levels which are either less than the positive voltage supply or else suffer from slow rise time characteristics. The enhancement mode configuration suffers from the former drawback and the enhancement/depletion mode configuration suffers from the latter.

The technique of using dynamic or pulsed use of depletion-mode MOSFET devices has been described in several publications. See for example, "Dynamic Depletion Mode: An E/D MOSFET Circuit Method for Improved Performance", by R. W. Knipper, IEEE Journal of Solid-State Circuits, Vol. SC-13, No. 5, October 1978, pp 542–547 and also "Dynamic Depletion Mode: An E/D MOSFET Circuit Method" 1978 IEEE International Solid-State Circuits Conference, pp. 16≠17, by the same author. These publications describe a number of circuits including drivers employing the dynamic depletion mode (DDM) technique, but not in a tri-state buffer configuration.

SUMMARY OF THE INVENTION

It is therefore an object of the invention to provide an improved tri-state output buffer circuit.

Another object of the invention is to provide an improved tri-state buffer which has both a fast response time as well as high output voltage characteristics.

Another object of the invention is to provide an improved tri-state output buffer utilizing dynamic depletion mode techniques.

A tri-state output buffer has the output characteristics of being in either a high voltage state (usually referred to as a binary "one" state) or a low or zero voltage state (usually referred to as a binary "zero" state) or, unlike a bi-state buffer, a third state: the "tri-state" or "high-Z" state. In this state the output is not driven to either a high or low state; but rather has a state that can be altered by outside circuit parameters. Data signals, as well as a tri-state control signal, dictate the status of the output of the tri-state buffer.

In accordance with the present invention a tri-state output buffer is provided which incorporates a dynamic depletion mode circuit. More particularly, the tri-state buffer has an output driver circuit which includes a pull-up and a pull-down transistor device. Rapid switching of the pull-up transistor from a non-conducting state to a conducting state is accomplished with a bootstrap circuit. The bootstrap circuit includes a capacitor and a DDM switching device. The DDM device acts to rapidly transfer the charge from the capacitor to the gate of the pull-up transistor, without voltage loss.

Circuitry is provided to cause the desired output state of the buffer, depending upon the input data signals and the state of the tri-state control signal. When the tri-state control signal is not activated, the circuit renders the pull-down transistor non-conducting and the pull-up transistor conducting (high output state) or vice versa (low output state). When the tri-state control signal is activated, both the pull-up and pull-down transistors are rendered non-conducting, thereby putting the buffer into the "high-Z" state.

In accordance with another aspect of the invention a second DDM device is used to charge the capacitor in the bootstrap circuit. Other features of the invention are described below.

DESCRIPTION OF THE PREFERRED EMBODIMENT

Figure 1:
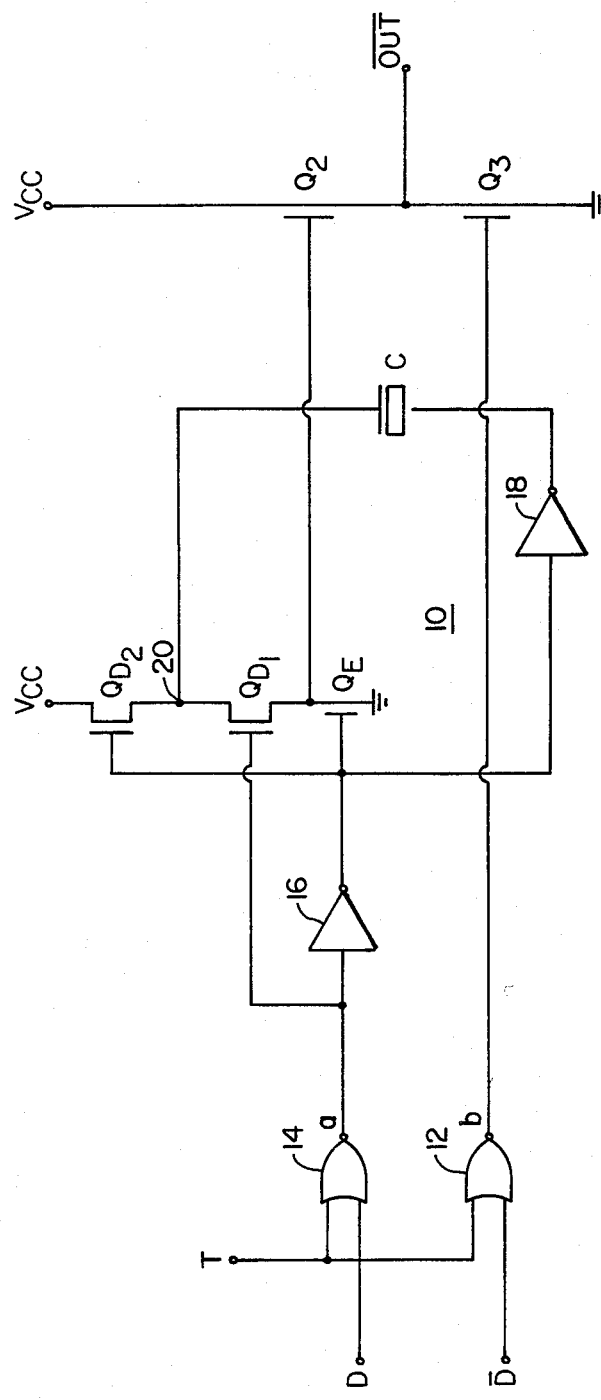
FIG. 1 is a schematic diagram of the improved tri-state output buffer of the present invention.

FIG. 1 is a schematic diagram of an improved tri-state output buffer circuit 10, in accordance with the present invention. Serially connected output driver transistors $Q_2$ and $Q_3$ form a push-pull circuit, with $Q_2$ being the pull-up (to $V_{cc}$) transistor and $Q_3$ being the pull-down (to ground) transistor.

Capacitor C in combination with the DDM MOS device $Q_{D1}$ form the major components of a bootstrap circuit for rapidly driving the gate of $Q_2$, when it is desired that $Q_2$ be in the conducting state. The pull-down transistor $Q_3$ is rendered conducting or non-conducting depending upon output b from NOR-gate 12. In the tri-state condition both $Q_2$ and $Q_3$ are rendered non-conducting. At all other times either $Q_2$ is conducting and $Q_3$ is not; or vice versa. When $Q_2$ is conducting the output, $\overline{OUT}$ is at $V_{cc}$, the "high" output state. When $Q_3$ is conducting $\overline{OUT}$ is at ground, the "low" output state.

Figure 2:
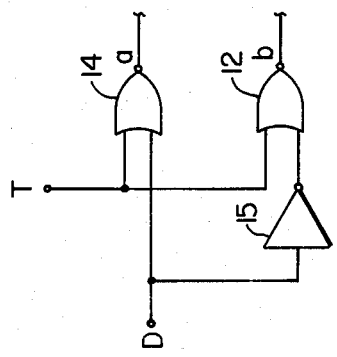
FIG. 2 is a schematic diagram of an alternative embodiment of the input to the tri-state output buffer of FIG. 1.

In FIG. 1 three inputs are provided into the circuit, two data signals, D and $\overline{D}$, and a tri-state control signal, T. The latter is provided to one input of NOR-gate 14 and an input to NOR-gate 12. Data signal D is provided to the other input of NOR-gate 14 and its compliment, $\overline{D}$, to the other input of NOR-gate 12. By the use of an inverter 15, as shown in FIG. 2, only the data signal D need be provided to buffer 10.

The truth table for buffer circuit 10 is shown in the following table:

TABLE NO. 1

|  | D | $\overline{D}$ | T | $\overline{OUT}$ |
|---|---|---|---|---|
| Case I. | 1 | 0 | 0 | 0 |
| Case II. | 0 | 1 | 0 | 1 |
| Case III. | X | X | 1 | High Z |

In Case III the tri-state control signal T is enabled, i.e. is a "1". In the other two cases, $\overline{OUT}$ is a function of the data input signals. The manner in which the tri-state buffer 10 arrives at each of these conditions will now be explained. To aid in this explanation, reference is made to the following three tables:

TABLE No. 2

| T | D | a |
|---|---|---|
| 0 | 0 | 1 |
| 0 | 1 | 0 |
| 1 | 0 | 0 |

TABLE No. 2-continued

| T | D | a |
|---|---|---|
| 1 | 1 | 0 |

TABLE No. 3

| T | $\overline{D}$ | b |
|---|---|---|
| 0 | 0 | 1 |
| 0 | 1 | 0 |
| 1 | 0 | 0 |
| 1 | 1 | 0 |

TABLE NO. 4

| | | a | b | $Q_{D1}$ | $G_{D1}$ | $Q_{D2}$ | $G_{D2}$ | $Q_E$ | $G_E$ | $Q_2$ | $G_2$ | $Q_3$ | $G_3$ |
|---|---|---|---|---|---|---|---|---|---|---|---|---|---|
| Case I | D = 1 | 0 | 1 | OFF | 0 | ON | 1 | ON | 1 | OFF | 0 | ON | 1 |
| | $\overline{D}$ = 0 | | | | | | | | | | | | |
| | T = 0 | | | | | | | | | | | | |
| | $\overline{OUT}$ = 0 | | | | | | | | | | | | |
| Case II | D = 0 | 1 | 0 | ON | 1 | OFF | 0 | OFF | 0 | ON | 1 | OFF | 0 |
| | $\overline{D}$ = 1 | | | | | | | | | | | | |
| | T = 0 | | | | | | | | | | | | |
| | $\overline{OUT}$ = 1 | | | | | | | | | | | | |
| Case III | D = X | 0 | 0 | OFF | 0 | ON | 1 | ON | 1 | OFF | 0 | OFF | 0 |
| | $\overline{D}$ = X | | | | | | | | | | | | |
| | T = 1 | | | | | | | | | | | | |
| | $\overline{OUT}$ = HIGH-Z | | | | | | | | | | | | |

Table No. 2 is the truth table for NOR-gate 14. Table No. 3 is the truth table for NOR-gate 12. The respective outputs a and b are shown for each of the NOR-gates as a function of their inputs in these two tables.

Table No. 3 shows the state of each of the active elements of buffer 10, and of the two NOR-gates, as a function of the data signals and the tri-state control signal. The letter "G" indicates the state of the gate for the particular device. The designation "OFF" indicates that the device is in the non-conducting state and the designation "ON" is indicative of the conducting state. It should be realized, however, that in the case of the two DDM devices $Q_{D1}$ and $Q_{D2}$ there is a certain amount of residual current in the "OFF" state.

Case I

The "0" at the output a of NOR-gate 14 shuts off $Q_{D1}$. Due to inverter 16 both $Q_{D2}$ and $Q_E$ are turned on. This allows capacitor C to charge from $V_{cc}$ through $Q_{D2}$. Residual current through $Q_{D1}$, which is "OFF", passes through $Q_E$. Since the gate of pull-up device $Q_2$ is at ground $Q_2$ is off. At the same time since NOR-gate output b is "1", $Q_3$ is conducting. The output, $\overline{OUT}$, is therefore "0".

Case II

Here $Q_{D1}$ is rendered conducting, while $Q_{D2}$ and $Q_E$ are turned off. The "0" at the output of inverter 16 is converted to a "1" by inverter 18. This results in an increase voltage at the base of C. This causes a voltage jump at node 20. Since $Q_{D1}$ is conducting this puts a high voltage at the gate of $Q_2$ causing it to turn on hard. Because capacitor C discharges through DDM device $Q_{D1}$, the gate of $Q_2$ is driven faster and to a higher voltage than would be the case with an enhancement or depletion/enhancement configuration. The DDM devices are faster because their internal resistance is very low while in the conducting state and yet are still switchable. Since both $Q_{D2}$ and $Q_E$ are off, the capacitor C discharge passes only through $Q_{D1}$. $Q_3$ is off since b is "0", the output, $\overline{OUT}$ is therefore in the high voltage state.

Case III

Here both outputs from the NOR-gates are "0" due to the enabling of the tri-state control signal T. With b being "0", $Q_3$ is non-conducting. Similarly since a is "0" $Q_2$ is turned off, just as in Case I.

In one particular embodiment of the present invention the following circuit component values were used.

$Q_{D2}$ = 0.6/0.4
$Q_{D1}$ = 0.4/0.8
$Q_E$ = 0.32/0.2
$Q_2$ = 12.8/0.2
$Q_3$ = 11.5/0.2
C = 1.1 pf.
$V_{cc}$ = +5 v.

Ratios for the transistors above are expressed in mils.

What is claimed:

1. A tri-state buffer circuit capable of providing at an output terminal of said circuit an output which is switchable between low and high level states in response to at least one data input signal and to a high impedance state in response to a control input signal, said buffer circuit comprising:

an output driver stage which includes a pull-up and a pull-down transistor, with each of said transistors having first and second electrodes which define the ends of conduction paths of said transistors and a gate electrode, with said first electrode of said pull-up transistor coupled to a power terminal of said buffer circuit and said second electrode of said pull-down transistor coupled to a circuit common terminal of said buffer circuit and said first and second electrodes of said respective pull-down and pull-up transistors coupled to said output terminal;

logic means for producing signals which cause said pull-up and pull-down transistors to switch said circuit output between said high and low level states in response to said at least one data input signal and to switch said circuit output to said high impedance state in response to said control input signal, independent of said at least one data input signal; and bootstrap circuit means for providing a gate control signal to said gate electrode of said pull-up transistor, said bootstrap circuit means including a capacitor for storing a charge and charge transfer means for transferring said charge to said gate electrode of said pull-up transistor and for maintaining said capacitor in a high charge state whenever said buffer circuit output is in said high impedance state, with said charge transfer means including a depletion mode transistor controlled by said logic means and driver means for providing an output switchable between low and high voltage states in response to said logic means, with a first terminal of said capacitor coupled to said depletion mode transistor and a second terminal of said capacitor coupled to said output of said driver means and wherein said logic means causes said driver means output to remain in said low voltage state whenever said buffer circuit output is in said high impedance state.

2. The buffer circuit of said claim 1 wherein an output of said logic means is coupled to said gate electrode of said pull-down transistor.

3. A tri-state buffer circuit capable of providing at an output terminal of said circuit an output which is switchable between low and high level states in response to at least one data input signal and to a high impedance state in response to a control input signal, said buffer circuit comprising:

an output driver stage which includes a pull-up and a pull-down transistor, with each of said transistors having first and second electrodes which define the ends of conduction paths of said transistors and a gate electrode, with said first electrode of said pull-up transistor coupled to a power terminal of said buffer circuit and said second terminal of said pull-down transistor coupled to a circuit common terminal of said buffer circuit, and said first and second electrodes of said respective pull-down and pull-up transistors coupled to said output terminal;

logic means for producing logic signals which cause said pull-up and pull-down transistors to switch said circuit output between said high and low level states in response to said at least one data input signal and to switch said circuit output to said high impedance state in response to said control input signal, independent of said at least one data input signal; and bootstrap circuit means for providing a gate control signal to said gate electrode of said pull-up transistor, said bootstrap circuit means including a capacitor for storing a charge and charge transfer means for transferring said charge to said gate electrode of said pull-up transistor exclusively in response to said logic means, with said charge transfer means including a depletion mode transistor controlled by said logic means and driver means for providing an output switchable between low and high voltage states in response to said logic means, with said capacitor having a first terminal coupled to said depletion mode transistor and a second terminal coupled to said output of said driver means and wherein said logic means causes said driver means output to be in said low voltage state whenever said buffer circuit is in said high impedance state.

* * * * *